United States Patent
Kawasaki et al.

[11] Patent Number: 6,084,336
[45] Date of Patent: Jul. 4, 2000

[54] PIEZOELECTRIC TRANSFORMER

[75] Inventors: Osamu Kawasaki, Kyotanabe; Katsunori Moritoki, Takatsuki; Hiroshi Nakatsuka, Neyagawa, all of Japan

[73] Assignee: Matsushita Electric Industrial Co., Ltd., Osaka, Japan

[21] Appl. No.: 09/154,737

[22] Filed: Sep. 17, 1998

[30] Foreign Application Priority Data

Sep. 17, 1997 [JP] Japan ................................. 9-252421

[51] Int. Cl.[7] .................................................. H01L 41/107
[52] U.S. Cl. ............................................ 310/359; 310/366
[58] Field of Search .................................. 310/359, 357, 310/366, 348

[56] References Cited

U.S. PATENT DOCUMENTS

| | | | |
|---|---|---|---|
| 2,974,296 | 3/1961 | Rosen | 310/359 |
| 5,504,384 | 4/1996 | Lee et al. | 310/359 |
| 5,701,049 | 12/1997 | Kanayama et al. | 310/359 |
| 5,747,914 | 5/1998 | Huang et al. | 310/318 |
| 5,751,092 | 5/1998 | Abe | 310/359 |
| 5,811,913 | 9/1998 | Kawai | 310/359 |
| 5,847,491 | 12/1998 | Taihaku et al. | 310/355 |
| 5,872,419 | 2/1999 | Hall et al. | 310/359 |

FOREIGN PATENT DOCUMENTS

| | | | |
|---|---|---|---|
| 63-272084 | 9/1988 | Japan | 310/359 |
| 7-74405 | 3/1995 | Japan | 310/359 |
| 9-74236 | 3/1997 | Japan | H01L 41/107 |
| 9-181371 | 7/1997 | Japan | H01L 41/107 |
| 9-321362 | 12/1997 | Japan | H01L 41/107 |

*Primary Examiner*—Thomas M. Dougherty
*Attorney, Agent, or Firm*—Smith, Gambrell & Russell, LLP

[57] ABSTRACT

A piezoelectric transformer has;
    a rectangular plate having a principal direction coinciding with a longitudinal direction or a lateral direction, said plate being made of a piezoelectric material;
    one set of primary electrodes which are formed on faces of said rectangular plate, respectively, said faces being opposed to each other in a thickness direction; and
    one set of secondary electrodes which are formed on said rectangular plate, wherein
    at least one of said primary electrodes covers a center portion of said rectangular plate with respect to said principal direction, and is disposed so as not to overlap with end portions of said rectangular plate with respect to said principal direction,
    each of said secondary electrodes consists of a single electrode member, and
    an AC voltage applied between said primary electrodes causes said rectangular plate to produce such a mechanical vibration of a half wave length that said rectangular plate expands and contracts in said principal direction, thereby outputting a voltage from said secondary electrodes.

15 Claims, 9 Drawing Sheets

→ P polarization direction

→ direction of polarization

→ p polarization direction

→ P polarization direction

PIEZOELECTRIC TRANSFORMER

BACKGROUND OF THE INVENTION

1. Field of the Invention

The invention relates to a piezoelectric transformer which transduces the amplitude of an AC voltage by means of a piezoelectric effect of a piezoelectric material such as piezoelectric ceramics.

2. Related art of the Invention

A piezoelectric transformer was developed in the late 1950s. At first, such a piezoelectric transformer was developed as a step-up transformer for a high-voltage power source. However, a piezoelectric transformer has constraints on a material, such as the breaking strength of a piezoelectric ceramic material. Therefore, the development has been aborted while it has not been commercially produced on a large scale. Recently, as development of high-strength piezoelectric ceramics is advancing and the request to miniaturize and thin a portable information device such as a notebook personal computer, an electronic organizer, and a game machine are increasing, a piezoelectric transformer again attracts much attention as a step-up transformer for an inverter power source of a back light of a liquid crystal display device which is mounted such a portable information device.

For example, an inverter for a back light of a liquid crystal display device is used in a light power source of a cold cathode fluorescent lamp which serves as a back light source. The inverter must convert a low DC voltage such as 3 V, 5 V, 9 V, or 12 V due to a battery or the like, to a high voltage of a high frequency which is about 1,000 Vrms in an ignition state and about 500 Vrms in a steady state. Today, an electromagnetic winding transformer is used in an inverter for a back light. In such an electromagnetic transformer, a lateral structure having a core of a special type is used so as to satisfy the request of thinning. In order to ensure the dielectric strength, however, miniaturization and thinning are limited. Moreover, the core loss, and the winding loss due to the use of a thin copper wire are large, and hence such a transformer has a defect that the efficiency is low.

By contrast, a piezoelectric transformer is configured in the following manner. Primary (input) and secondary (output) electrodes are formed on a piezoelectric ceramic material such as lead zirconate titanate (PZT) or a piezoelectric crystal material such as lithium niobate. An AC voltage of a frequency in the vicinity of the resonance frequency of the piezoelectric transformer is applied between the primary electrodes to cause the piezoelectric transformer to mechanically vibrate. This mechanical vibration is transduced by means of the piezoelectric effect and then output from the secondary electrode as a high-voltage power. A piezoelectric transformer has features that it can be miniaturized, particularly thinned more easily than an electromagnetic transformer, and that a higher efficiency is attained.

Hereinafter, a piezoelectric transformer of the prior art will be described with reference to the drawings.

FIG. 10 is a schematic view of a Rosen-type piezoelectric transformer 101 of the prior art. This transformer has a configuration in which, on a rectangular plate 105 which is made of a piezoelectric ceramic material such as lead zirconate titanate (PZT), primary (input) electrodes 102 are formed so as to occupy a substantially half of the principal face and to be opposed to each other, and a secondary (output) electrode 103 is formed on an end face. As shown in the figure by arrows and P, the rectangular plate 105 is previously polarized in the thickness direction by using the primary electrodes 102, and in the longitudinal direction by using the secondary electrode 103. When an AC voltage of a frequency in the vicinity of the resonance frequency of the piezoelectric transformer 101 is applied between the primary electrodes 102, the piezoelectric transformer 101 produces a mechanical vibration in which expansion and contraction occur in the longitudinal direction. The mechanical vibration is transduced by means of the piezoelectric effect into a high voltage, and the high voltage is output from the secondary electrode 102.

FIG. 11 is a diagram showing a side view of the piezoelectric transformer 101 shown in FIG. 10, the displacement distribution, and the charge distribution. Referring to the figure, when a high voltage is applied to the primary electrode 102a and the secondary electrode 103 with using the primary electrode 102b as a common electrode, the primary electrode pair 102a and 102b causes the rectangular plate 105 to be polarized in the thickness direction, and the secondary electrode pair 103 and 102b causes the rectangular plate 105 to be polarized in the longitudinal direction, as shown by arrows in the figure. When, after the polarization, an AC voltage of a frequency in the vicinity of the resonance frequency of the rectangular plate 105 is applied to the electrode 102a with using the primary electrode 102b as a common electrode, the rectangular plate 105 produces a mechanical vibration in the longitudinal direction and having the displacement distribution shown in FIG. 11. This mechanical vibration is transduced by means of the piezoelectric effect into a high voltage, and the high voltage can be output from the secondary electrode pair 103 and 102b. A piezoelectric transformer of this kind was invented by Rosen, and hence is called a Rosen-type piezoelectric transformer. Among piezoelectric transformers of this type, a transformer which excites a stretching vibration of a half wave length as in the case of the longitudinal displacement distribution shown in FIG. 11 is often called a $\lambda/2$ mode ($\lambda$ indicates one wavelength) Rosen-type piezoelectric transformer. With respect to a certain driving frequency of a required high AC voltage, a $\lambda/2$ mode Rosen-type piezoelectric transformer is the smallest one among piezoelectric transformers in which the resonance frequency coincides with the driving frequency. Therefore, a $\lambda/2$ mode Rosen-type piezoelectric transformer is usually used.

In the above-described piezoelectric transformer of the prior art, on the rectangular plate 105 which is made of a piezoelectric ceramic material such as lead zirconate titanate (PZT), the primary (input) electrodes 102a and 102b are formed on a substantially half of the principal face so as to be opposed to each other, and the secondary (output) electrode 103 is formed on the end face. FIG. 12 shows frequency characteristics of the input admittance as seen from the primary side of the piezoelectric transformer shown in FIG. 10. As seen from FIG. 12, in a $\lambda/2$ mode Rosen-type piezoelectric transformer of the prior art, both the $\lambda/2$ (½-wavelength) vibration mode which is the fundamental vibration mode, and the $\lambda$ (1-wavelength) vibration mode can be strongly excited.

When the transformer is driven by an AC voltage such as a rectangular wave, containing many frequency components, therefore, also the $\lambda$ (1-wavelength) vibration mode is strongly excited together with the $\lambda/2$ (½-wavelength) vibration mode which is the fundamental vibration mode. As a result, distortions and stresses due to the $\lambda$ vibration mode are superimposed on those due to the λ/2 vibration mode, so that distortions and stresses of the piezoelectric transformer are increased. This produces a problem in that the characteristics are impaired and the transformer is broken, thereby lowering the reliability.

Japanese patent publication (Unexamined) No. HEI9-181371 discloses a piezoelectric transformer device in which a primary electrode elongates from one end portion in the longitudinal direction so as to exceed the center portion, and a secondary electrode is formed on the other end portion. FIG. 13 shows the piezoelectric transformer device, and FIG. 14 shows frequency characteristics of the input admittance as seen from the primary side of the piezoelectric transformer shown in FIG. 13. In this way, the formation of the primary electrode which exceeds the center portion causes induced charges of the λ vibration mode to be partly canceled. In this structure, however, the suppression effect of the λ vibration mode is small. Actually, also a vibration of the λ (1-wavelength) vibration mode is therefore excited. Consequently, it is impossible to strongly excite only the λ/2 (½-wavelength) vibration mode which is the fundamental vibration mode.

As a result, in the same manner as a Rosen-type piezoelectric transformer of the prior art, the output AC voltage is not a sinusoidal wave but an AC voltage containing high frequency components. Depending on the kind of the load, the sinusoidal-wave driving may be required. The existence of such high frequency components produces problems in that the reliability of the load and the circuit efficiency are lowered, and that undesired electromagnetic waves are radiated to the outside.

Japanese patent publication (Unexamined) No. HEI9-74236 discloses a center-driven piezoelectric transformer device which is a λ/2 mode piezoelectric transformer. FIG. 15 shows the piezoelectric transformer device having a structure in which a driving portion that is polarized in the thickness direction is disposed in the center portion and a generating portion that is polarized toward the end and in the longitudinal direction is disposed in each of the sides of the driving portion. FIG. 16 shows frequency characteristics of the input admittance as seen from the primary side of the piezoelectric transformer shown in FIG. 15. As seen from FIG. 16, a λ/2 mode Rosen-type piezoelectric transformer of this type is excellent in that only the λ/2 (½-wavelength) vibration mode which is the fundamental vibration mode can be strongly excited.

In a piezoelectric transformer of this structure, however, secondary output terminals are located at the ends of the device, respectively. When both the terminals are to be connected to each other, therefore, a wiring for a high voltage must be formed on the circuit. This produces a problem in that undesired electromagnetic waves are radiated. Furthermore, the characteristics are fluctuated by a stray capacity due to this wiring. The electric connection must be made at portions respectively corresponding to two antinodes of the vibration, thereby producing a problem in that a vibration is hindered and hence the efficiency is lowered.

In order to avoid this problem, only one of the output terminals may be used. In this case, for the sake of the reliability and safety of the device, the other secondary terminal must be connected to a load or to the ground. This produces problems in that the circuit efficiency is lowered by the connection of a load, and that the different output voltages at the ends lower the reliability of the piezoelectric transformer device.

SUMMARY OF THE INVENTION

In view of the problems of a piezoelectric transformer of the prior art, it is an object of the invention to provide a piezoelectric transformer in which a vibration of the λ vibration mode is suppressed and only the λ/2 vibration mode is excited, thereby reducing distortions and stresses in vibrations, and which has a high reliability.

A piezoelectric transformer of the present invention comprises:

a rectangular plate having a principal direction coinciding with a longitudinal direction or a lateral direction, said plate being made of a piezoelectric material;

one set of primary electrodes which are formed on faces of said rectangular plate, respectively, said faces being opposed to each other in a thickness direction; and one set of secondary electrodes which are formed on said rectangular plate, wherein at least one of said primary electrodes covers a center portion of said rectangular plate with respect to said principal direction, and is disposed so as not to overlap with end portions of said rectangular plate with respect to said principal direction, each of said secondary electrodes consists of a single electrode member, and an AC voltage applied between said primary electrodes causes said rectangular plate to produce such a mechanical vibration of a half wave length that said rectangular plate expands and contracts in said principal direction, thereby outputting a voltage from said secondary electrodes.

DESCRIPTION OF THE PREFERRED EMBODIMENTS

Hereinafter, embodiments of the invention will be described with reference to the accompanying drawings.

First Embodiment

Figure 1:
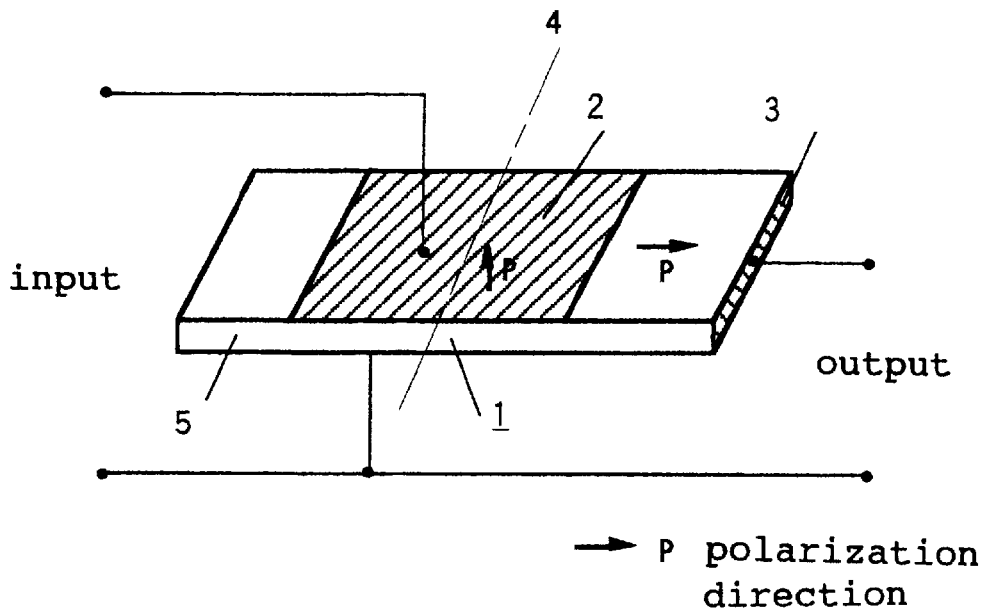
FIG. 1 is a diagram of a λ/2 mode piezoelectric transformer of a first embodiment of the invention.
Figure 2:
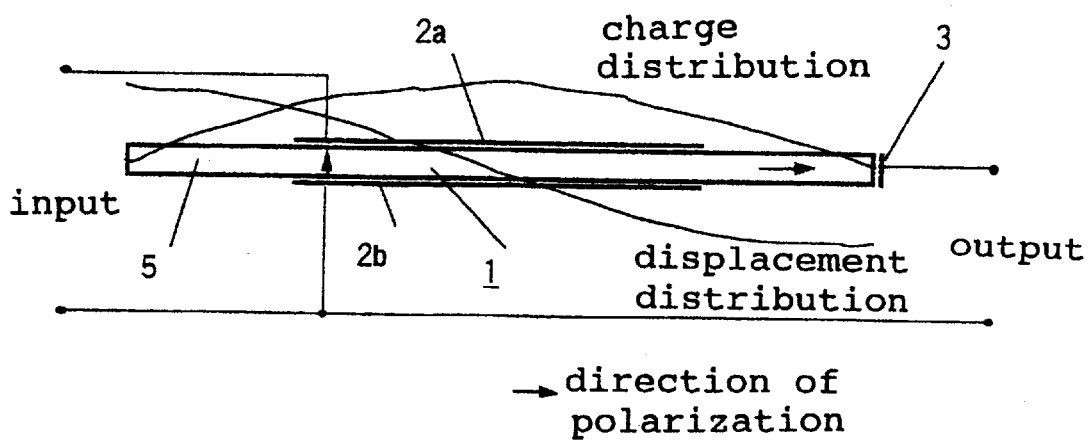
FIG. 2 is a diagram showing a side view of the piezoelectric transformer of the first embodiment of the invention, the displacement distribution, and the charge distribution.

FIG. 1 is a diagram of a λ/2 mode piezoelectric transformer of a first embodiment of the invention, and FIG. 2 is a diagram showing a side view of the piezoelectric transformer 1 shown in FIG. 1, and the displacement distribution and the charge distribution in the case where the piezoelectric transformer operates. Referring to FIGS. 1 and 2, the piezoelectric transformer 1 comprises: a rectangular plate 5 which is made of a piezoelectric ceramic material such as lead zirconate titanate (PZT) or a piezoelectric crystal material such as lithium niobate; an electrode 2a which is formed as a primary (input) electrode so that its center line substantially coincides with the center line 4 of one principal face; an electrode 2b which is formed as a common electrode on a face opposite to the one principal face so as to correspond to the electrode 2a; and an electrode 3 which is formed as a secondary (output) electrode on an end face perpendicular to the longitudinal direction, i.e., on a face on the short side of the principal face. The electrodes 2a and 2b are shorter in length than the rectangular plate 5. The end portions of the electrodes do not overlap with the short sides of the principal face. The electrodes 2a, 2b, and 3 are made of a metal such as silver, nickel, or gold and formed by a method such as deposition, sputtering, printing, or plating.

In the case where the rectangular plate 5 is made of piezoelectric ceramics, it is required to respectively apply appropriate DC high voltages to the electrodes 2a and 3 with using the electrode 2b as a common electrode, whereby the rectangular plate 5 is previously polarized in the thickness direction by using the primary electrode pair 2a and 2b, and in the longitudinal direction by using the secondary electrode pair 3 and 2b. In the case where the rectangular plate 5 is made of a piezoelectric ceramic material, it is not required to previously polarize the rectangular plate.

Next, the operation of the thus configured embodiment will be described. When an AC voltage of a frequency in the vicinity of the resonance frequency of the rectangular plate 5 is applied to the electrode 2a with using the primary electrode 2b as a common electrode, the rectangular plate 5 produces a mechanical resonant vibration in which expansion and contraction occur in the longitudinal direction. This mechanical vibration is transduced by means of the piezoelectric effect into a high voltage so as to be output from the secondary electrode pair 3 and 2b.

Figure 3:
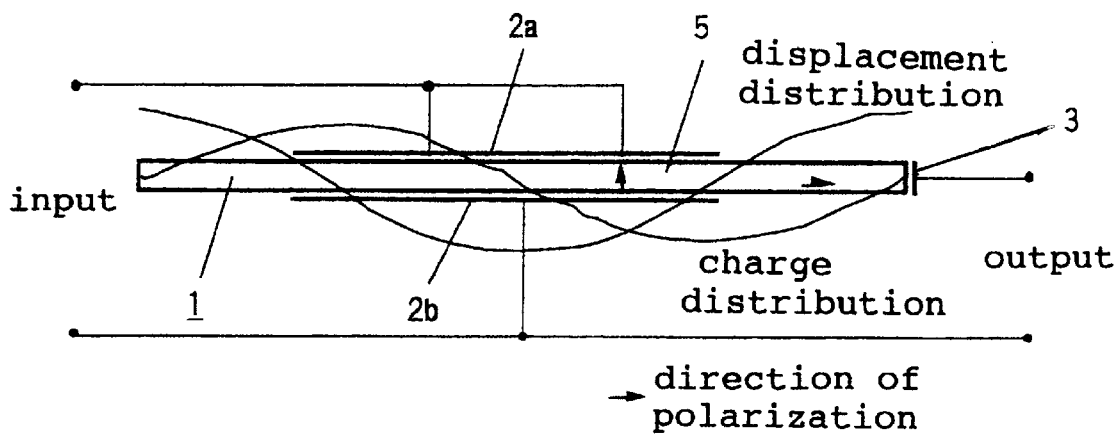
FIG. 3 is a diagram showing a side view of a piezoelectric transformer in the λ vibration mode which is configured in a similar manner as the λ/2 piezoelectric transformer of the first embodiment of the invention, the displacement distribution, and the distribution of charges.

FIG. 2 is a diagram showing the displacement distribution of a mechanical resonant vibration in which expansion and contraction occur in the longitudinal direction during the operation (vibration excitation) of the piezoelectric transformer 1 in the λ/2 vibration mode shown in FIG. 1, and also the distribution of charges induced by the vibration. By contrast, FIG. 3 is a diagram showing the displacement distribution of a mechanical resonant vibration in which expansion and contraction occur in the longitudinal direction during the operation of a piezoelectric transformer in the λ vibration mode that is configured in a similar manner as the piezoelectric transformer 1 in the λ/2 vibration mode shown in FIG. 1, and also the distribution of charges induced by the vibration. In FIGS. 2 and 3, both the displacement distribution and the charge distribution are shown in such a manner that the direction of the abscissa coincides with the longitudinal direction the piezoelectric transformer 1 and the original coincides with the center of the rectangular plate 5. The piezoelectric transformer of FIG. 2 is identical in structure with the piezoelectric transformer of FIG. 3. The figures show the difference of the vibration modes. For the sake of comparison with FIG. 2, the same reference numerals as those of FIG. 2 are used in FIG. 3. As seen from FIGS. 2 and 3, induced charges in the λ/2 mode in the whole area have the same sign as shown in FIG. 2, and the sign of induced charges in the λ mode is changed at the center portion as shown in FIG. 3. When the primary electrode is formed on a substantially half of one side of the principal face in the same manner as a piezo electric transformer of the prior art, therefore, vibrations of both the λ/2 and λ modes can be similarly excited. In this case, when the transformer is driven by an AC voltage such as a rectangular wave containing many frequency components, both the λ/2 vibration mode which is the fundamental vibration mode, and the λ (1-wavelength) vibration mode are strongly excited. To comply with this, in the embodiment, the primary electrode 2 is formed in a substantially center portion of the principal face of the piezoelectric transformer 1 as shown in FIG. 1. In the center portion, the amount of induced charges of the primary electrode due to the λ/2 mode is large, but induced charges in the λ mode are substantially canceled with each other and the amount of the induced charge is small because the sign of induced charges in the λ mode is changed at the center line 4 of the rectangular plate 5 which is within the electrode portion. As a result, the λ/2 vibration mode which is the fundamental vibration mode can be strongly excited, but the λ vibration mode can be excited only in a very low degree.

Figure 4:
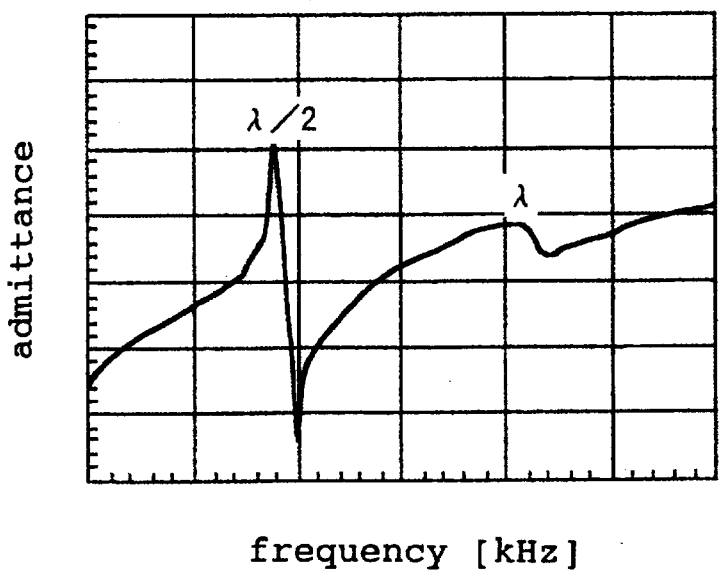
FIG. 4 is a frequency characteristic diagram of the admittance of the λ/2 piezoelectric transformer of the first embodiment of the invention.

FIG. 4 shows frequency characteristics of the input admittance as seen from the primary side of the piezoelectric transformer 1 shown in FIG. 1. In a λ/2 mode Rosen-type piezoelectric transformer of the prior art, both the λ/2 mode which is the fundamental vibration mode, and the λ mode are strongly excited. By contrast, as seen from FIG. 4, in the λ/2 mode piezoelectric transformer 1 in the embodiment, only the λ/2 mode which is the fundamental vibration mode is strongly excited. Even when the transformer is driven by an AC voltage such as a rectangular wave containing many frequency components, therefore, it is possible to strongly excite only the λ/2 mode which is the fundamental vibration mode. According to this configuration, distortions and stresses of the piezoelectric transformer are prevented from being increased by superimposition caused by simultaneous excitation of multiple vibration modes. As a result, it is possible to realize a piezoelectric transformer in which the problem of reduction of the reliability such as that the characteristics are impaired and the transformer is broken is solved, and which has a high reliability. Furthermore, the output AC voltage is a sinusoidal wave. Therefore, the reliability of the load and the circuit efficiency are prevented from being lowered, and the problem in that undesired electromagnetic waves are radiated to the outside can be solved. As a result, a piezoelectric transformer which is high in efficiency and reliability, which generates a small amount of undesired electromagnetic waves, and which does not damage the load can be realized.

In the invention, in the case of piezoelectric ceramics, the secondary electrode is formed only in one end portion, and polarization is performed by using the electrode. In the other end portion, a voltage is not generated by vibration. Therefore, a high voltage is not generated in the other end portion. As a result, it is possible to solve the problems of reduction of the efficiency due to the connection of a load, radiation of undesired electromagnetic waves due to the connection of the secondary terminals, reduction of the reliability of the device due to unbalanced characteristics, and reduction of the circuit efficiency due to hindrance of vibration.

In the embodiment described above, with respect to the one set of the secondary electrodes in the invention, one of the secondary electrodes is the electrode which is a common electrode with one of the primary electrodes, and the other secondary electrode is formed on the end face which is perpendicular to the longitudinal direction of the rectangular plate. The invention is not restricted to this. The electrodes may not be configured as a common electrode. Alternatively, the common electrode may be formed as described above, and the other electrode may be formed on the principal face of the rectangular plate and in the vicinity of an end face which is perpendicular to the longitudinal direction. In these cases, the piezoelectric transformers can attain the same effects as those described above although the step-up ratio is slightly changed.

In the embodiment described above, the one set of the primary electrodes in the invention are substantially disposed in the center portion in the longitudinal direction of the principal face of the rectangular plate. Even when the primary electrodes are somewhat displaced from the center portion, the same effects can be attained.

When the ratio of the primary electrode with respect to the total length of the rectangular plate is increased, the efficiency may be varied even in the case where the same load is used. In order to efficiently ignite a cold cathode fluorescent lamp, preferably, the primary electrode exceeds the center portion by a range which is not larger than one fourth of the total length of the rectangular plate.

When the primary electrode is indented from the lateral end portions by a range which is one fourth of the total length, at the maximum, it is possible to obtain an output with a higher efficiency than a piezoelectric transformer of the prior art.

When the upper primary electrode is formed asymmetrically with respect to the center portion, it is possible to attain an effect that also another vibration mode can be suppressed.

The upper primary electrode is separated from the above-mentioned lateral end portions. However, it is preferable to connect the electrode to the other end portions, i.e., the back and front end portions.

The structure of the rectangular plate may be formed by a laminated member. However, the rectangular plate preferably has an integral structure formed by a non-laminated member.

Second Embodiment

Figure 5:
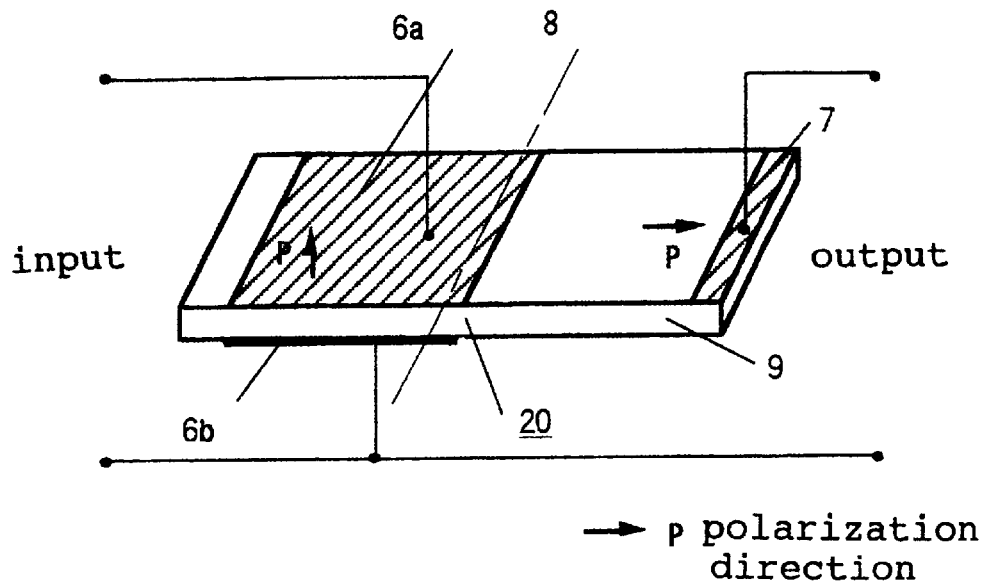
FIG. 5 is a diagram of a λ/2 mode piezoelectric transformer of a second embodiment of the invention.

Next, a second embodiment of the invention will be described with reference to the accompanying drawings. FIG. 5 is a diagram of a $\lambda/2$ mode piezoelectric transformer of the second embodiment of the invention. Referring to the figure, the piezoelectric transformer 20 comprises: a rectangular plate 9 which is made of a piezoelectric ceramic material such as lead zirconate titanate (PZT) or a piezoelectric crystal material such as lithium niobate; electrodes 6a and 6b which are formed as primary (input) electrodes and on the principal faces of the rectangular plate so as to be opposed to each other (the electrode 6b on the opposite face is not shown in the figure, but actually formed on the opposite face); and an electrode 7 which is formed as a secondary (output) electrode and on the face where the electrode 6a is formed, and in the vicinity of the end face perpendicular to the longitudinal direction, i.e., the face on the short side of the principal face. At least one of the electrodes 6a and 6b is formed so that one end is indented from the end face of the rectangular plate and the other end exceeds the center line 8 of the rectangular plate. The electrodes 6a, 6b, and 7 are made of a metal such as silver, nickel, or gold and formed by a method such as deposition, sputtering, printing, or plating.

In the case where the rectangular plate 9 is made of piezoelectric ceramics, it is required to respectively apply appropriate DC high voltages to the electrodes 6a and 7 with using the electrode 6b as a common electrode, whereby, as shown by the arrow and P in FIG. 5, the rectangular plate 9 is previously polarized in the thickness direction by using the primary electrode pair 6a and 6b, and in the longitudinal direction by using the secondary electrode pair 7 and 6b. In the case where the rectangular plate 9 is made of a piezoelectric ceramic material, it is not required to previously polarize the rectangular plate.

Next, the operation of the thus configured embodiment will be described. When an AC voltage of a frequency in the vicinity of the resonance frequency of the rectangular plate 9 is applied to the electrode 6a with using the primary electrode 6b as a common electrode, the rectangular plate 9 produces a mechanical resonant vibration in which expansion and contraction occur in the longitudinal direction. This mechanical vibration is transduced by means of the piezoelectric effect into a high voltage so as to be output from the secondary electrode pair 7 and 6b.

The relationships between displacement distribution of a mechanical resonant vibration in which expansion and contraction occur in the longitudinal direction during the operation (vibration excitation) of the piezoelectric transformer 20 in the $\lambda/2$ vibration mode, and the distribution of charges induced by the vibration are identical with those shown in FIG. 2. The relationships between the displacement distribution of a mechanical resonant vibration in which expansion and contraction occur in the longitudinal direction during the operation of a piezoelectric transformer in the $\lambda$ vibration mode that is configured in a similar manner as the piezoelectric transformer 20 in the $\lambda/2$ vibration mode are identical with those shown in FIG. 3. In the same manner as the first embodiment, when the primary electrode is formed on a substantially half of one side of the principal face in the same manner as a piezoelectric transformer of the prior art, therefore, vibration of both the $\lambda/2$ and $\lambda$ modes can be similarly excited. Consequently, when the transformer is driven by an AC voltage such as a rectangular wave containing many frequency components, both the $\lambda/2$ vibration mode which is the fundamental vibration mode, and the $\lambda$ (1-wavelength) vibration mode are strongly excited. In the embodiment, at least one of the primary electrode pair 6a and 6b is formed so that one end is indented from the end face of the rectangular plate and the other end exceeds the center line 8 of the rectangular plate. In the whole electrode area, the amount of induced charges of the primary electrode due to the $\lambda/2$ vibration mode is large as a result of superimposition, but induced charges in the λ mode are canceled with each other and the amount of the induced charges is small because the sign of induced charges in the λ mode is changed at the center line 8 of the piezoelectric transformer 20 which is within the electrode portion and the charges are canceled with each other. As a result, the λ/2 vibration mode which is the fundamental vibration mode can be strongly excited, but the λ vibration mode can be excited only in a very low degree.

Figure 6:
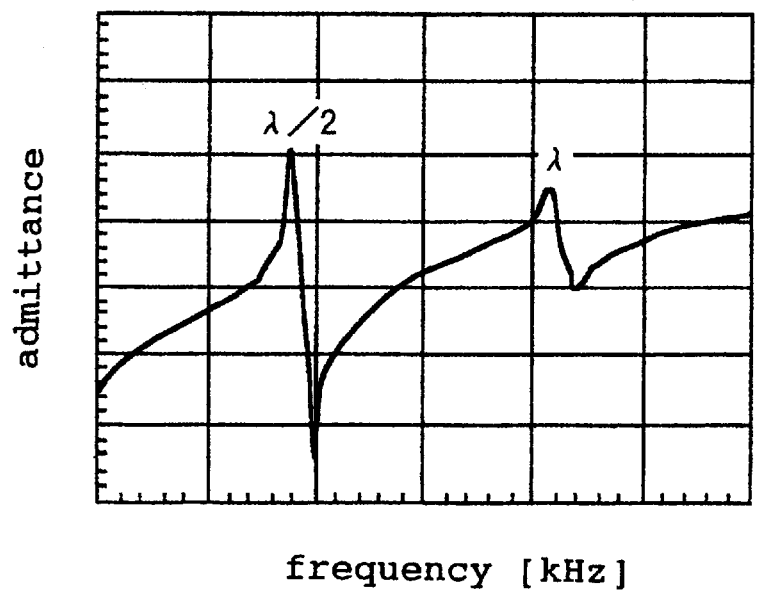
FIG. 6 is a frequency characteristic diagram of the admittance of the λ/2 mode piezoelectric transformer of the second embodiment of the invention.

FIG. 6 shows frequency characteristics of the input admittance as seen from the primary side of the piezoelectric transformer 20 shown in FIG. 5. In a λ/2 mode Rosen-type piezoelectric transformer of the prior art, both the λ/2 mode which is the fundamental vibration mode, and the λ mode are strongly excited. By contrast, as seen from FIG. 6, in the λ/2 mode piezoelectric transformer 20 in the embodiment, only the λ/2 mode which is the fundamental vibration mode is strongly excited, and the λ mode can be excited only in a very low degree. Even when the transformer is driven by an AC voltage such as a rectangular wave containing many frequency components, therefore, it is possible to strongly excite only the λ/2 mode which is the fundamental vibration mode. According to this configuration, distortions and stresses of the piezoelectric transformer due to simultaneous excitation of multiple vibration modes in the piezoelectric transformer are prevented from being increased as a result of superimposition. As a result, it is possible to realize a piezoelectric transformer in which the problem of reduction of the reliability such as that the characteristics are impaired and the transformer is broken is solved, and which has a high reliability. Furthermore, the output AC voltage is a sinusoidal wave. Therefore, the reliability of the load and the circuit efficiency are prevented from being lowered, and the problem in that undesired electromagnetic waves are radiated to the outside can be solved. As a result, a piezoelectric transformer which is high in efficiency and reliability, which generates a small amount of undesired electromagnetic waves, and which does not damage the load of the piezoelectric transformer can be realized.

In the invention, in the case of piezoelectric ceramics, the secondary electrode is formed only in one end portion, and polarization is performed by using the electrode. In the other end portion, i.e., the portion where the electrode is indented, therefore, a voltage is not generated by vibrations. Consequently, a high voltage is not generated in the other end portion. As a result, it is possible to solve the problems of reduction of the efficiency due to the connection of a load, radiation of undesired electromagnetic waves due to the connection of the secondary terminals, reduction of the reliability of the device due to unbalanced characteristics, and reduction of the circuit efficiency due to hindrance of vibration.

In the embodiment described above, with respect to the one set of the secondary electrodes in the invention, one of the secondary electrodes is the electrode which is a common electrode with one of the primary electrodes, and the other secondary electrode is formed on the principal face of the rectangular plate and in the vicinity of the end face which is perpendicular to the longitudinal direction. The invention is not restricted to this. The electrodes may not be configured as a common electrode. Alternatively, the common electrode may be formed as described above, and the other electrode may be formed on an end face which is perpendicular to the longitudinal direction of the rectangular plate. In these cases, the piezoelectric transformers can attain the same effects as those described above although the step-up ratio is slightly changed.

When the ratio of the primary electrode with respect to the total length is increased, the efficiency may be varied even in the case where the same load is used. In order to efficiently ignite a cold cathode fluorescent lamp, preferably, the primary electrode exceeds the center portion by a range which is not larger than one fourth of the total length.

When the primary electrode is indented from the lateral end portions by a range which is one fourth of the total length, at the maximum, it is possible to obtain an output with a higher efficiency than a piezoelectric transformer of the prior art. When the primary electrode is formed asymmetrically with respect to the center portion, it is possible to attain an effect that also another vibration mode can be suppressed.

Third Embodiment

Figure 7:
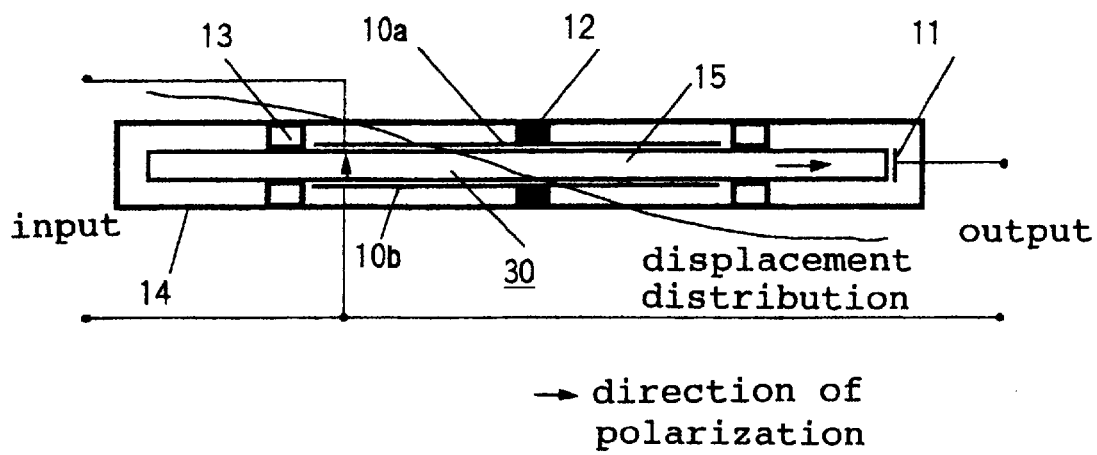
FIG. 7 is a diagram showing a section view of a λ/2 mode piezoelectric transformer of a third embodiment of the invention, and the displacement distribution.

Next, a third embodiment of the invention will be described with reference to the accompanying drawings. FIG. 7 is a diagram showing a section view of a structure for supporting a λ/2 mode piezoelectric transformer of the third embodiment of the invention, and the displacement distribution in the case where the piezoelectric transformer operates. Referring to the figure, the piezoelectric transformer 30 comprises: a rectangular plate 15 which is made of a piezoelectric ceramic material such as lead zirconate titanate (PZT) or a piezoelectric crystal material such as lithium niobate; an electrode 10a which is formed as a primary (input) electrode so that its center line substantially coincides with the center line of one principal face of the rectangular plate; an electrode 10b which is formed as a common electrode on a face opposite to the principal face so as to correspond to the electrode 10a; and an electrode 11 which is formed as a secondary (output) electrode on an end face perpendicular to the longitudinal direction, i.e., the face on the short side of the principal face. The configuration of the piezoelectric transformer 30 of the embodiment is different from that of the piezoelectric transformer 1 of the first embodiment, in that the piezoelectric transformer 30 of the embodiment is accommodated in a case 14 by means of support members 12 and 13. Therefore, the description of the configuration which is identical with that of the first embodiment is omitted. The components which are not particularly described are configured in the same manner as those of the first embodiment.

Figure 8:
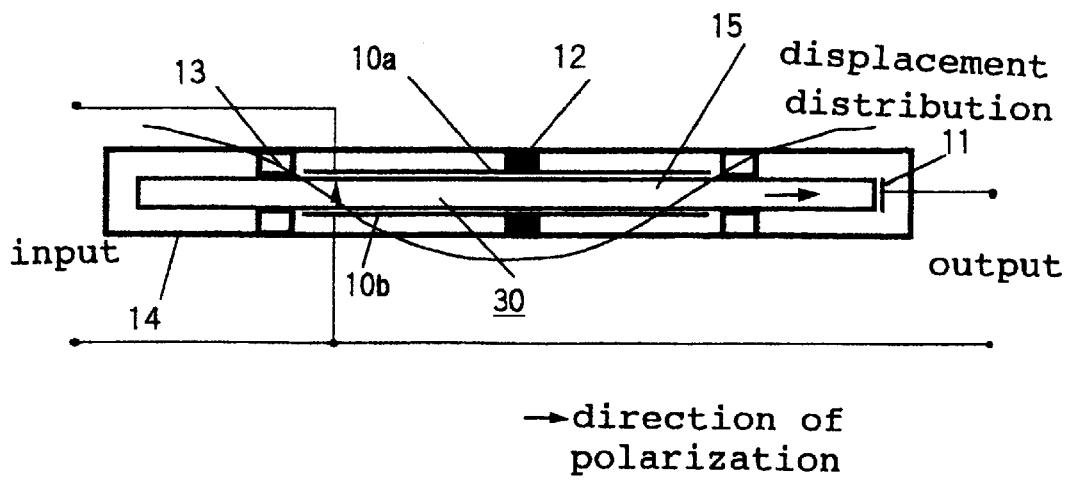
FIG. 8 is a diagram showing a side view of a piezoelectric transformer in the λ vibration mode which is configured in a similar manner as the λ/2 mode piezoelectric transformer of the third embodiment of the invention, and the distribution of charges.

FIG. 7 shows the displacement distribution of a mechanical resonant vibration in which expansion and contraction occur in the longitudinal direction during the operation (vibration excitation) of the piezoelectric transformer 30 in the λ/2 vibration mode. By contrast, FIG. 8 is a diagram showing the displacement distribution of a mechanical resonant vibration in which expansion and contraction occur in the longitudinal direction during the operation of a piezoelectric transformer in the λ vibration mode that is configured in a similar manner as the piezoelectric transformer 30 in the λ/2 vibration mode shown in FIG. 7. As shown in FIG. 7, the vibration displacement in the λ/2 vibration mode is zero at the center of the piezoelectric transformer 30. When the transformer is supported at the center, therefore, it is possible to realize a support structure in which vibration hindrance is suppressed as much as low as possible. In the embodiment, the piezoelectric transformer 30 is supported by housing it in the case 14 and then sandwiching it from both the sides by means of the support members 12. In the structure in which the piezoelectric transformer 30 is supported at one point, the posture of the transformer may be unstable. Therefore, the piezoelectric transformer is further supported by sandwiching it from both the upper and lower sides by means of the support members 13, at points other than those which are respectively separated from the end faces perpendicular to the longitudinal direction of the piezoelectric transformer 30, by a distance equal to one fourth of the length of the piezoelectric transformer 30. In the embodiment, the both sides of the piezoelectric transformer 30 are supported. Alternatively, the transformer may be supported at one side only. In the embodiment, in order to reduce vibration hindrance, the material of the support members 13 is more elastic (softer) than that of the support members 12. In order to reduce vibration hindrance, the support width of the support members 13 may be made larger, and that of the support members 12 may be made smaller.

As shown in FIG. 8, the displacement distribution in the case where the piezoelectric transformer 30 is driven in the $\lambda$ vibration mode is zero at positions which are respectively separated from the end faces perpendicular to the longitudinal direction of the piezoelectric transformer 30, by a distance equal to one fourth of the length of the piezoelectric transformer 30. When the piezoelectric transformer 30 is supported at the center portion where the vibration displacement in the $\lambda$ vibration mode is larger, therefore, it is possible to realize a support structure in which a vibration of the $\lambda$ mode is suppressed as much as possible. Since the piezoelectric transformer is sandwiched from both the upper and lower sides by means of the support members 13 at points other than those which are respectively separated from the end faces perpendicular to the longitudinal direction of the piezoelectric transformer 30, by a distance equal to one fourth of the length of the piezoelectric transformer 30, the effect which is exerted by the support on vibrations of the $\lambda/2$ mode and the $\lambda$ mode can be made equal in degree to that which is exerted by the support on vibration of the $\lambda$ mode. In other words, since the piezoelectric transformer 30 is supported at the center portion, and points other than those which are respectively separated from the end faces perpendicular to the longitudinal direction by a distance equal to one fourth of the length of the piezoelectric transformer 30, it is possible to realize a support structure in which vibration hindrance on the $\lambda/2$ mode only is suppressed and vibration of the $\lambda$ mode is reduced.

In order to suppress as much as possible the effect which is exerted by the support on vibration of the $\lambda/2$ mode, preferably, the support is performed in the vicinity of a node of vibration of the $\lambda/2$ mode and antinodes of vibration of the $\lambda$ mode in the longitudinal direction, i.e., in the range of a distance equal to one fourth of the length from the center portion.

Figure 9:
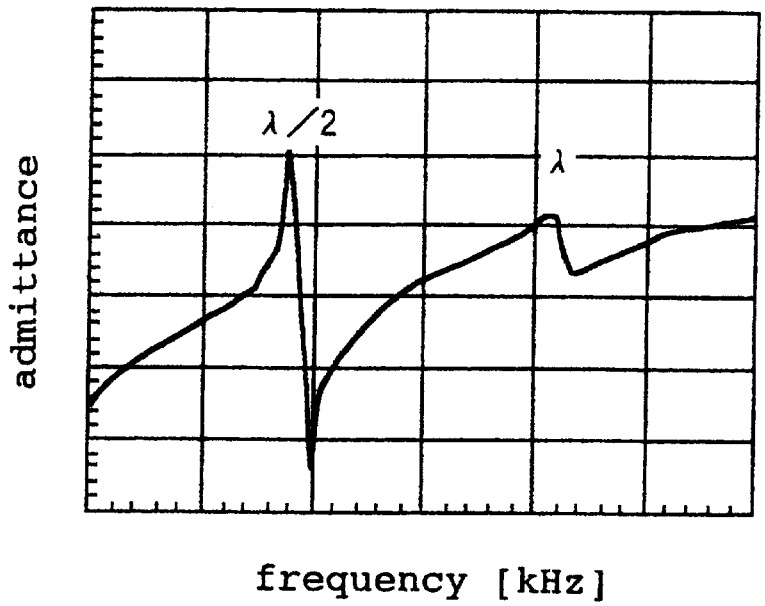
FIG. 9 is a frequency characteristic diagram of the admittance of the λ/2 mode piezoelectric transformer of the third embodiment of the invention.
Figure 10:
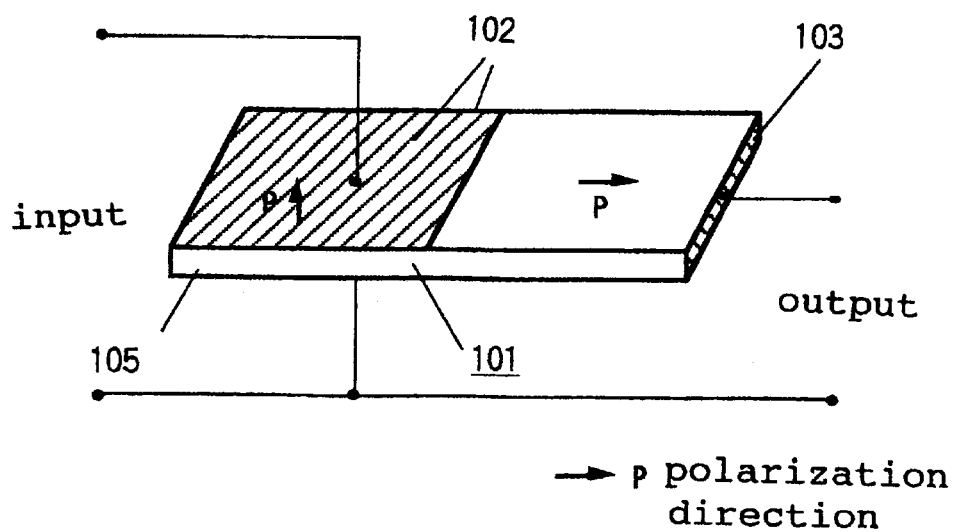
FIG. 10 is a schematic view of a λ/2 mode Rosen-type piezoelectric transformer of the prior art.
Figure 11:
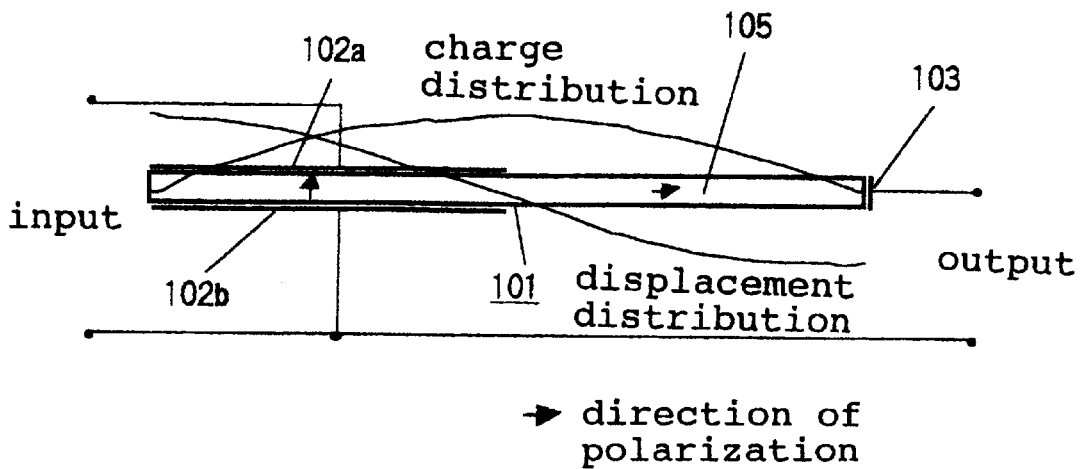
FIG. 11 is a diagram showing a side view of the piezoelectric transformer of the prior art, the displacement distribution, and the charge distribution.
Figure 12:
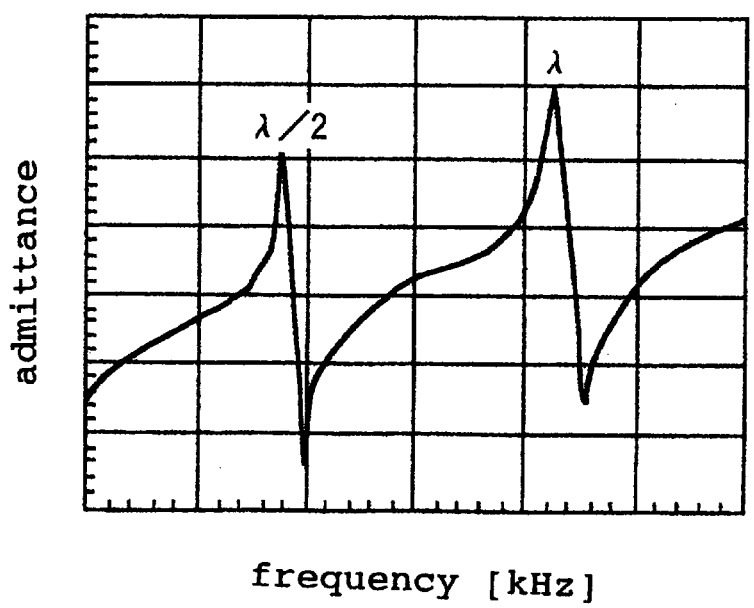
FIG. 12 is a frequency characteristic diagram of the admittance of a Rosen-type piezoelectric transformer of the prior art.
Figure 13:
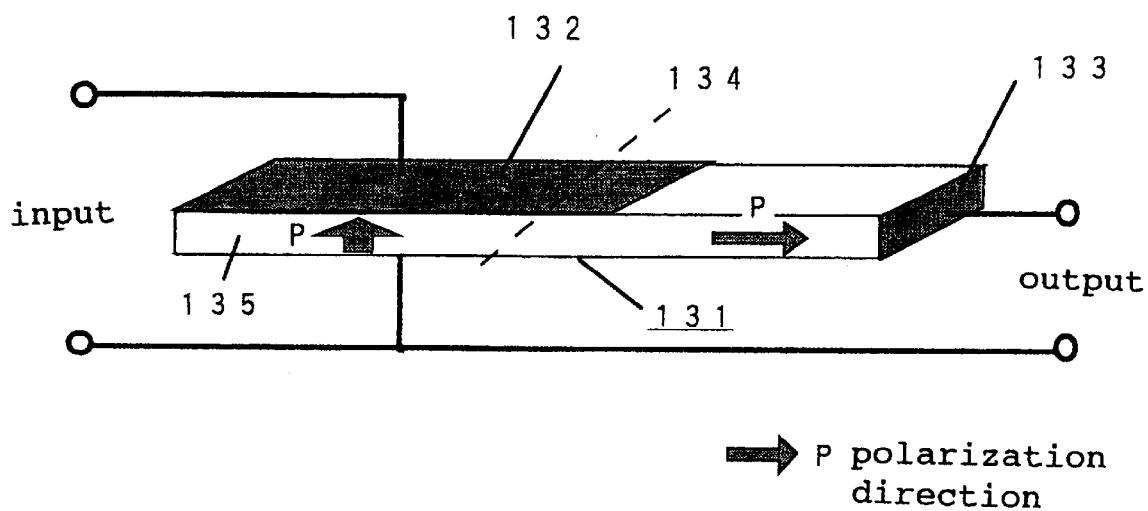
FIG. 13 is a diagram illustrating the structure of a piezoelectric transformer of the prior art.
Figure 14:
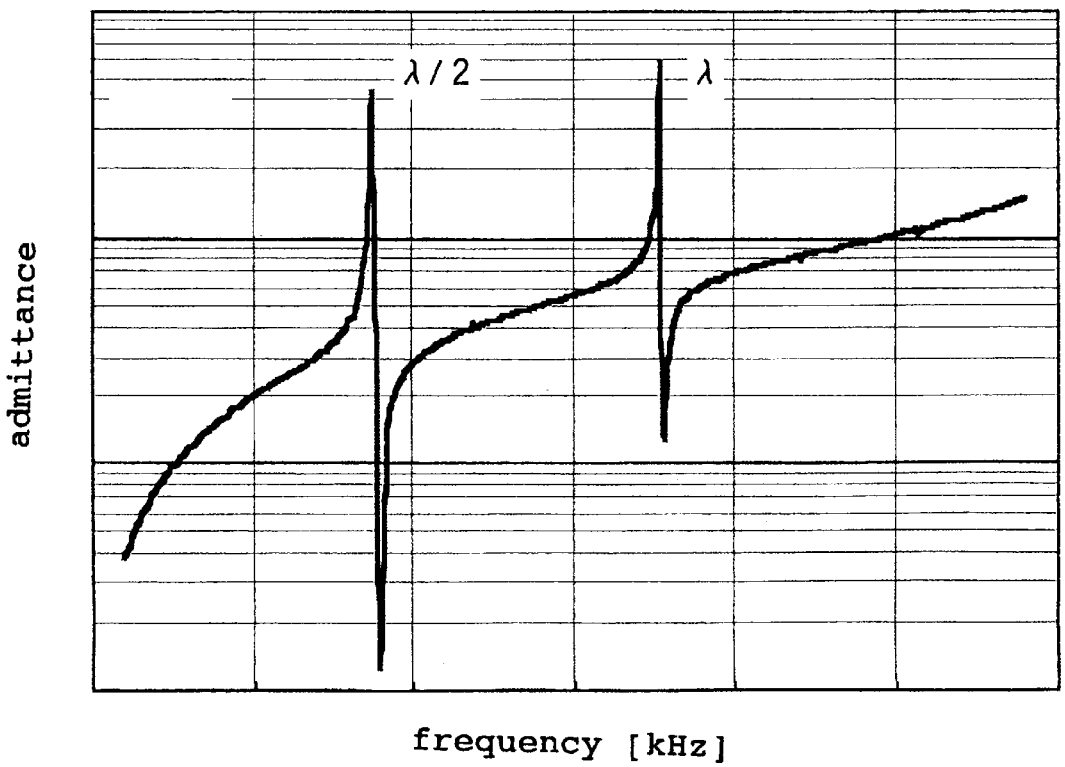
FIG. 14 is a frequency characteristic diagram of the admittance of the piezoelectric transformer of the prior art.
Figure 15:
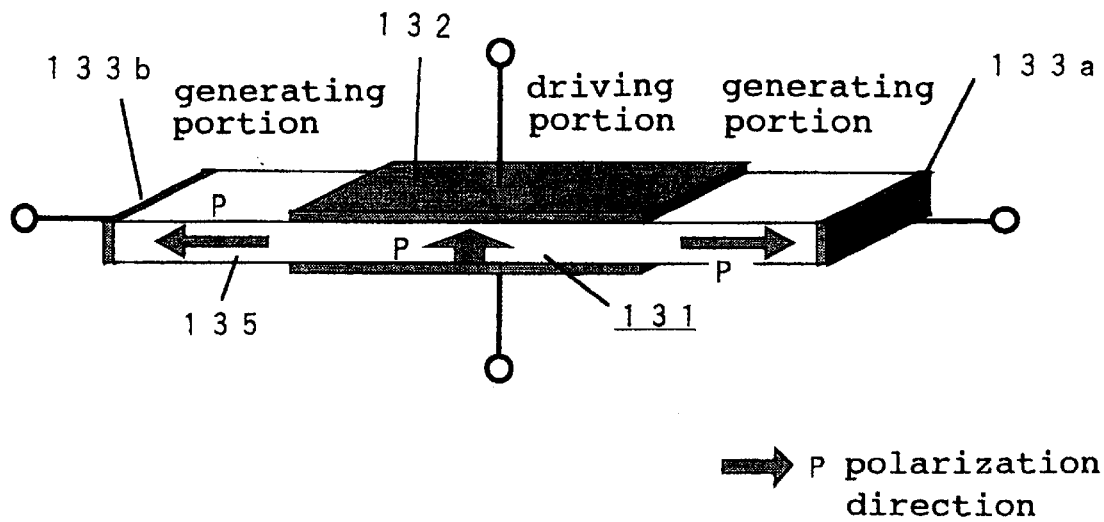
FIG. 15 is a diagram illustrating the structure of a piezoelectric transformer of the prior art.
Figure 16:
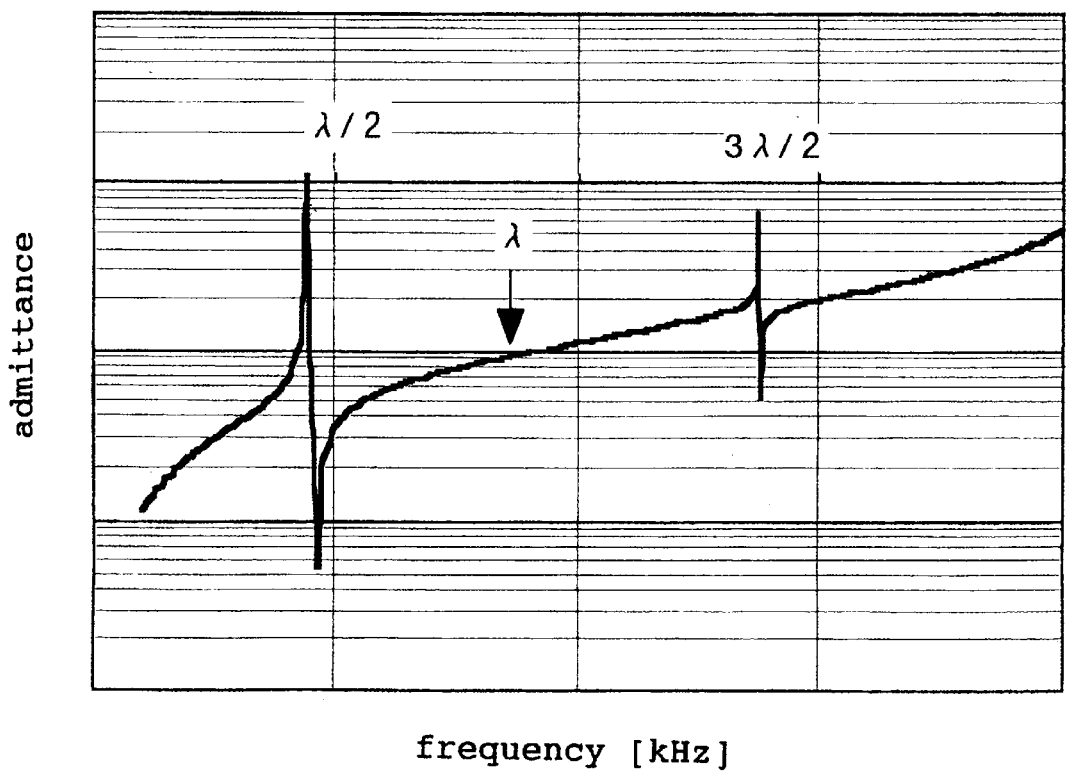
FIG. 16 is a frequency characteristic diagram of the admittance of the piezoelectric transformer of the prior art.

FIG. 9 shows frequency characteristics of the input admittance as seen from the primary side of the piezoelectric transformer 30 shown in FIG. 7. In a $\lambda/2$ mode Rosen-type piezoelectric transformer of the prior art, both the $\lambda/2$ mode which is the fundamental vibration mode, and the $\lambda$ mode are strongly excited. By contrast, as seen from FIG. 9, in the invention, only the $\lambda/2$ mode which is the fundamental vibration mode is strongly excited, and the $\lambda$ mode can be excited only in a very low degree. Even when the transformer is driven by an AC voltage such as a rectangular wave containing many frequency components, therefore, it is possible to strongly excite only the $\lambda/2$ mode which is the fundamental vibration mode. According to this configuration, distortions and stresses of the piezoelectric transformer are prevented from being increased, with the result that it is possible to realize a piezoelectric transformer in which the problem of reduction of the reliability such as that the characteristics are impaired and the transformer is broken is solved, and which has a high reliability.

Furthermore, the output AC voltage is a sinusoidal wave. Therefore, the reliability of the load and the circuit efficiency are prevented from being lowered, and the problem in that undesired electromagnetic waves are radiated to the outside can be solved. As a result, a piezoelectric transformer which is high in efficiency and reliability, which generates a small amount of undesired electromagnetic waves, and which can perform a driving operation without damaging the load of the piezoelectric transformer can be realized.

In the embodiment described above, with respect to the one set of the secondary electrodes in the invention, one of the secondary electrodes is the electrode which is a common electrode with one of the primary electrodes, and the other secondary electrode is formed on the end face which is perpendicular to the longitudinal direction of the rectangular plate. The invention is not restricted to this. The electrodes may not be configured as a common electrode. Alternatively, the common electrode may be formed as described above, and the other electrode may be formed on the principal face of the rectangular plate and in the vicinity of an end face which is perpendicular to the longitudinal direction of the rectangular plate. In these cases, the piezoelectric transformers can attain the same effects as those described above although the step-up ratio is slightly changed.

In the embodiment described above, the one set of the primary electrodes in the invention are substantially disposed in the center portion in the longitudinal direction of the principal face of the rectangular plate. Even when the primary electrodes are somewhat displaced from the center portion of the rectangular plate as in the case of the piezoelectric transformer 20 of the second embodiment, the same effects can be attained by the above-described support structure.

In the first to third embodiments, the principal direction of the rectangular plate in the invention coincides with the direction perpendicular to the short side of the rectangular plate, i.e., the longitudinal direction of the rectangular plate. The invention is not restricted to this. The principal direction may coincide with the direction perpendicular to the long side of the rectangular plate, i.e., the lateral direction of the rectangular plate.

Figure 17:
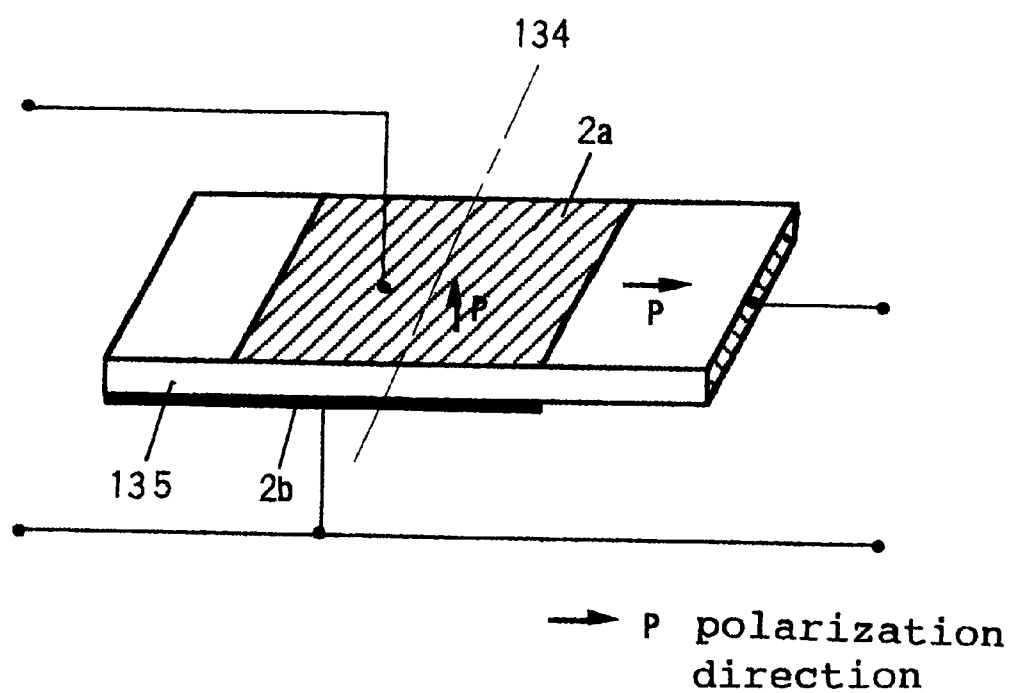
FIG. 17 is a diagram of a λ/2 mode piezoelectric transformer of another embodiment of the invention.

Now as apparent from FIG. 17 the lower primary electrode 2b reaches the both side edges with regard to the direction perpendicular to the primary direction of the rectangular plate 135.

As apparent from the above description, according to the invention, it is possible to provide a piezoelectric transformer in which vibration of the $\lambda$ vibration mode is suppressed and only the $\lambda/2$ vibration mode is excited, thereby reducing distortions and stresses in vibrations, and which has a high reliability.

What is claimed is:

1. A piezoelectric transformer comprising
    a rectangular plate having a principal direction coinciding with a longitudinal or lateral direction, said plate being made of a piezoelectric material;
    one set of primary electrodes which are formed on faces of said rectangular plate, respectively, said faces being opposed to each other in a thickness direction; and
    one set of secondary electrodes which are formed on said rectangular plate, wherein
        at least one of said primary electrodes covers a center portion of said rectangular plate with respect to said principal direction, and is disposed so as not to overlap with end portions of said rectangular plate with respect to said principal direction, polarization in said principal direction exists only in one of two side areas of said rectangular plate, said areas existing at said end portions respectively and not being covered with said electrode which covers said center portion, one of said secondary electrodes is disposed in such a side of said rectangular plate where the polarization exists, and an AC voltage applied between said primary electrodes causes said rectangular plate to produce such a mechanical vibration of a half wave length that said rectangular plate expands and contracts in said principal direction, thereby outputting a voltage from said secondary electrodes.

2. A piezoelectric transformer according to claim 1, wherein said piezoelectric material is piezoelectric ceramics, and said rectangular plate is previously polarized in said thickness direction by using said primary electrodes, and in said principal direction by using at least one of said secondary electrodes.

3. A piezoelectric transformer according to claim 1, wherein said principal direction coincides with said longitudinal direction.

4. A piezoelectric transformer according to claim 2, wherein said principal direction coincides with said longitudinal direction.

5. A piezoelectric transformer according to claim 1, wherein one of said primary electrodes serves also as one of said secondary electrodes.

6. A piezoelectric transformer according to claim 5, wherein another one of said secondary electrodes is formed on side faces of said end portions of said rectangular plate with respect to said principal direction.

7. A piezoelectric transformer according to claim 5, wherein another one of said secondary electrodes is formed on such face of said rectangular plate on which said one primary electrode is formed, and in the vicinity of the end portion of said rectangular plate with respect to said principal direction.

8. A piezoelectric transformer according to claim 1, wherein both of said primary electrodes are disposed in said center portion of said rectangular plate with respect to said principal direction.

9. A piezoelectric transformer according to claim 1, wherein one of said primary electrodes exceeds said center portion toward corresponding one of said secondary electrodes, by a range which is one fourth of a length of said rectangular plate in said principal direction, at the maximum.

10. A piezoelectric transformer according to claim 1, wherein said at least one of said primary electrodes which covers said center portion is indented from said respective end portions of said rectangular plate, by a range which is one fourth of a length of said rectangular plate in said principal direction, at the maximum.

11. A piezoelectric transformer according to claim 1, wherein said at least one of said primary electrodes which covers said center portion is not symmetric in said principal direction with respect to said center portion.

12. A piezoelectric transformer according to claim 1, wherein said at least one of said primary electrodes which covers said center portion is disposed under such state that said one primary electrode reaches both side end portions of said rectangular plate with respect to a direction perpendicular to said principal direction.

13. A piezoelectric transformer according to claim 1, wherein said rectangular plate is substantially supported at a center portion in said principal direction.

14. A piezoelectric transformer according to claim 13, wherein said rectangular plate is supported also at a position other than any position that is separated from said ends portions of said rectangular plate with respect to said principal direction, by a distance which is substantially one fourth of a length of said rectangular plate.

15. A piezoelectric transformer according to claim 1, wherein said rectangular plate is not a plate which is produced by lamination, but an integral plate.

* * * * *